United States Patent
Shima et al.

(10) Patent No.: US 9,818,904 B2
(45) Date of Patent: Nov. 14, 2017

(54) METHOD OF MANUFACTURING SOLAR CELL

(71) Applicant: SANYO Electric Co., Ltd., Osaka (JP)

(72) Inventors: Masaki Shima, Kyoto (JP); Shinji Kobayashi, Hyogo (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 103 days.

(21) Appl. No.: 14/591,425

(22) Filed: Jan. 7, 2015

(65) Prior Publication Data
US 2015/0125986 A1 May 7, 2015

Related U.S. Application Data

(63) Continuation of application No. PCT/JP2012/069421, filed on Jul. 31, 2012.

(51) Int. Cl.
| | | |
|---|---|---|
| *B07C 5/02* | (2006.01) | |
| *H01L 21/67* | (2006.01) | |
| *H01L 31/18* | (2006.01) | |
| *B08B 3/10* | (2006.01) | |
| *H01L 31/0236* | (2006.01) | |

(52) U.S. Cl.
CPC ............ *H01L 31/18* (2013.01); *B08B 3/10* (2013.01); *H01L 31/02363* (2013.01); *Y02E 10/50* (2013.01)

(58) Field of Classification Search
CPC ......... H01L 21/67057; H01L 21/67086; H01L 31/18; H01L 21/02057; H01L 21/67092; H01L 21/6732; H01L 21/67326; Y10S 134/902

USPC ........................................................ 438/57
See application file for complete search history.

(56) References Cited

U.S. PATENT DOCUMENTS

| | | | | |
|---|---|---|---|---|
| 4,251,317 A | * | 2/1981 | Foote | C30B 33/00 156/345.11 |
| 4,675,067 A | * | 6/1987 | Valley | C23F 1/08 134/184 |
| 5,014,727 A | * | 5/1991 | Aigo | B01F 3/04241 134/102.2 |

(Continued)

FOREIGN PATENT DOCUMENTS

| | | |
|---|---|---|
| JP | H02-113332 U | 9/1990 |
| JP | H10-303443 A | 11/1998 |

(Continued)

*Primary Examiner* — Bradley K Smith
*Assistant Examiner* — David Goodwin
(74) *Attorney, Agent, or Firm* — Metrolexis Law Group, PLLC

(57) ABSTRACT

In a processing of immersing substrates in a chemical solution, and agitating the chemical solution by as bubbles or liquid, the gas bubbles or liquid is supplied so as to bring about alternate occurrence of a first state and a second state. The first state is a state in which an amount of the gas bubbles or the liquid supplied to first side in one direction of each substrate is greater than an amount of the gas bubbles or the liquid supplied to a second side in the one direction of the substrate. The second state is a state in which the amount of the gas bubbles or the liquid supplied to the first side in the one direction of the substrate is smaller than the amount of the gas bubbles or the liquid supplied to the second side in the one direction of the substrate.

10 Claims, 3 Drawing Sheets

(56) References Cited

U.S. PATENT DOCUMENTS

| | | | | |
|---|---|---|---|---|
| 5,340,437 A | * | 8/1994 | Erk | H01L 21/02019 |
| | | | | 156/345.23 |
| 5,904,156 A | * | 5/1999 | Advocate, Jr. | C11D 7/261 |
| | | | | 134/1 |
| 6,006,765 A | * | 12/1999 | Skrovan | B08B 3/102 |
| | | | | 134/1 |
| 6,156,968 A | | 12/2000 | Nishimoto et al. | |
| 6,340,640 B1 | | 1/2002 | Nishimoto et al. | |
| 6,352,084 B1 | * | 3/2002 | Oshinowo | H01L 21/67051 |
| | | | | 134/182 |
| 6,391,145 B1 | | 5/2002 | Nishimoto et al. | |
| 7,807,017 B2 | | 10/2010 | Kim et al. | |
| 2008/0017313 A1 | | 1/2008 | Kim et al. | |
| 2008/0146003 A1 | * | 6/2008 | Wang | B28D 5/0082 |
| | | | | 438/464 |
| 2012/0006726 A1 | * | 1/2012 | Kusuhara | B28D 5/0082 |
| | | | | 209/3.1 |

FOREIGN PATENT DOCUMENTS

| | | |
|---|---|---|
| JP | 2001-93891 A | 4/2001 |
| JP | 2004-288967 A | 10/2004 |
| JP | 2007-324567 A | 12/2007 |
| JP | 2010-082558 A | 4/2010 |
| JP | 2012-015135 A | 1/2012 |
| WO | 2007-123198 A1 | 11/2007 |

* cited by examiner

US 9,818,904 B2

METHOD OF MANUFACTURING SOLAR CELL

CROSS REFERENCE TO RELATED APPLICATIONS

This application is a continuation application of International Application No. PCT/JP2012/069421, filed on Jul. 31, 2012, entitled "METHOD OF MANUFACTURING SOLAR CELL", the entire contents of which are incorporated herein by reference.

TECHNICAL FIELD

The invention relates to a method of manufacturing a solar cell.

BACKGROUND ART

In recent years, solar cells have been drawing attention as a low environmental-load energy source. Especially, solar cells including a substrate made of a semiconductor material such as a crystalline silicon substrate have been drawing attention.

In manufacturing such a solar cell including a substrate made of a semiconductor material, it is necessary to perform a step of wet etching the substrate such as a step of forming a relief structure called a texture structure on a surface of the substrate made of the semiconductor material (see Japanese Patent Application Publication No. Hei 10-303443 (Patent Document 1), for example).

SUMMARY OF THE INVENTION

A step of cleaning the substrate is processed after the step of etching the substrate or doing the like. In the cleaning step, the above-described etching step, and the like, it is necessary to bring the entire substrate into uniform contact with a chemical solution, because if an insufficiently cleaned portion or an insufficiently etched portion occurs on the substrate, such a portion may lead to a failure to obtain a desired solar cell and may decrease a production yield.

A method of manufacturing a solar cell according to an embodiment relates to a method of manufacturing a solar cell including a substrate made of a semiconductor material. A method of manufacturing a solar cell according to an embodiment includes a processing step. In the processing step, substrates are processed by immersing the substrates arranged in one direction in a chemical solution, and agitating the chemical solution by supplying gas bubbles or a liquid into the chemical solution. In the processing step, the gas bubbles or the liquid is supplied so as to bring about alternate occurrence of a first state and a second state, where the first state is a state in which an amount of the gas bubbles or the liquid supplied to first side in the one direction of the substrate is greater than an amount of the gas bubbles or the liquid supplied to a second side in the one direction of the substrate, and the second state is a state in which the amount of the gas bubbles or the liquid supplied to the first side in the one direction of the substrate is smaller than the amount of the gas bubbles or the liquid supplied to the second side in the one direction of the substrate.

DETAILED DESCRIPTION

Figure 1:
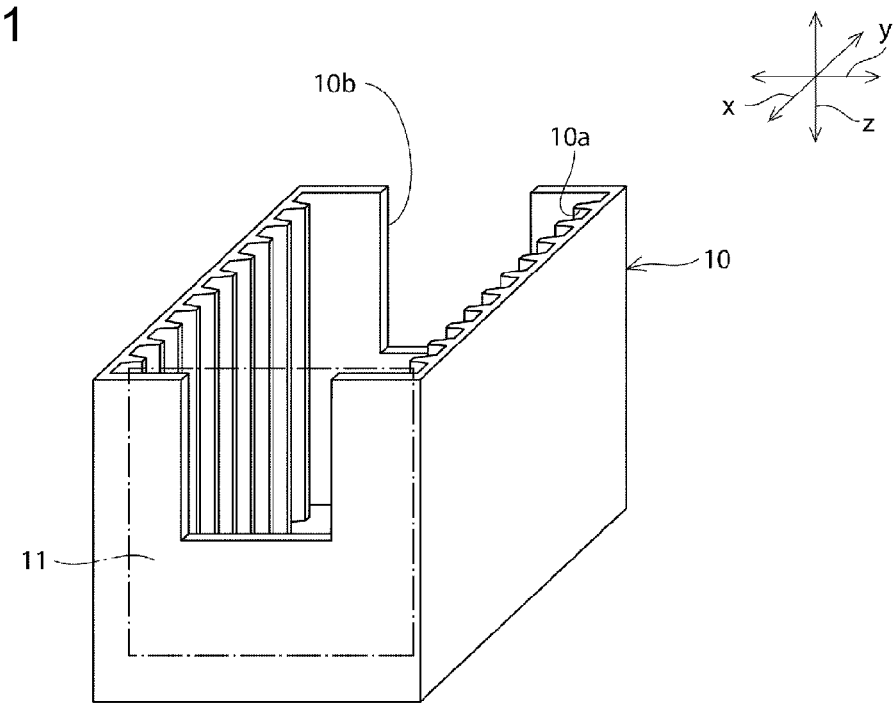
FIG. 1 is a schematic perspective view of a cassette in a first embodiment.

Embodiments of method of manufacturing a solar cell are described below. It is to be noted, however, that the following embodiments are mere examples and the invention is not limited only to the following embodiments.

Meanwhile, in the drawings to be referred to in regard to the embodiments and the like, members having substantially the same functions are denoted by the same reference numerals. In addition, the drawings to be referred to in regard to the embodiments and the like are schematically described and dimensional ratios and the like of objects illustrated in the drawings may be different from dimensional ratios and the like of actual objects. Such dimensional ratios and the like of the objects may also vary among the drawings. Specific dimensional ratios and the like of the objects are to be determined in consideration of the following descriptions.

First Embodiment

This embodiment describes a method of manufacturing a solar cell including a substrate made of a semiconductor material. Such a substrate made of a semiconductor material may be a crystalline silicon substrate. In other words, the method of manufacturing a solar cell of the invention may be regarded as a method of manufacturing a crystalline silicon solar cell.

The solar cell may include, for example, a substrate made of a semiconductor material, a first semiconductor layer having one conductivity type and provided on one principal surface of the substrate, a second semiconductor layer having another conductive type and provided on another principal surface of the substrate, a first electrode provided on the first semiconductor layer, and a second electrode provided on the second semiconductor layer.

Alternatively, the solar cell may be aback junction solar cell which includes, for example, the substrate made of a semiconductor material, the first and second semiconductor layers provided on the one principal surface of the substrate, the first electrode provided on the first semiconductor layer, and the second electrode provided on the second semiconductor layer.

A relief structure called a texture structure for enhancing efficiency of light incidence on the substrate may be provided at least on one of the principal surfaces of the substrate made of a semiconductor material. The texture structure can be formed by anisotropically etching the surface of the silicon substrate, for example.

The method of manufacturing a solar cell of the embodiment includes a processing step of processing the substrate made of the semiconductor material by immersing the substrate in a chemical solution. Specific examples of the processing step include a cleaning step of cleaning the substrate by immersing the substrate in a cleaning solution, an etching step of etching the substrate by immersing the substrate in an etching solution, and the like. It is preferable to perform at least one of the cleaning step and the etching step as the processing step.

In manufacturing the solar cell, two or more processing steps are likely to take place as in the case of performing the etching step and then performing the cleaning step. In this case, however, the processing step described in the embodiment in at least any one of the processing steps may be conducted. In other words, not all the processing steps need to be performed in a manner similar to the processing step described in the embodiment.

The substrate subjected to the processing step may be formed only from the substrate made of a semiconductor material, or may be a substrate made of a semiconductor material and provided, on its surface, with a layer such as a semiconductor layer or a protective layer, or with a component such as an electrode.

Details of the processing step of the embodiment are described below with reference to FIG. 1 to FIG. 5.

(Setting Substrates 11 in Cassette 10)

Figure 2:
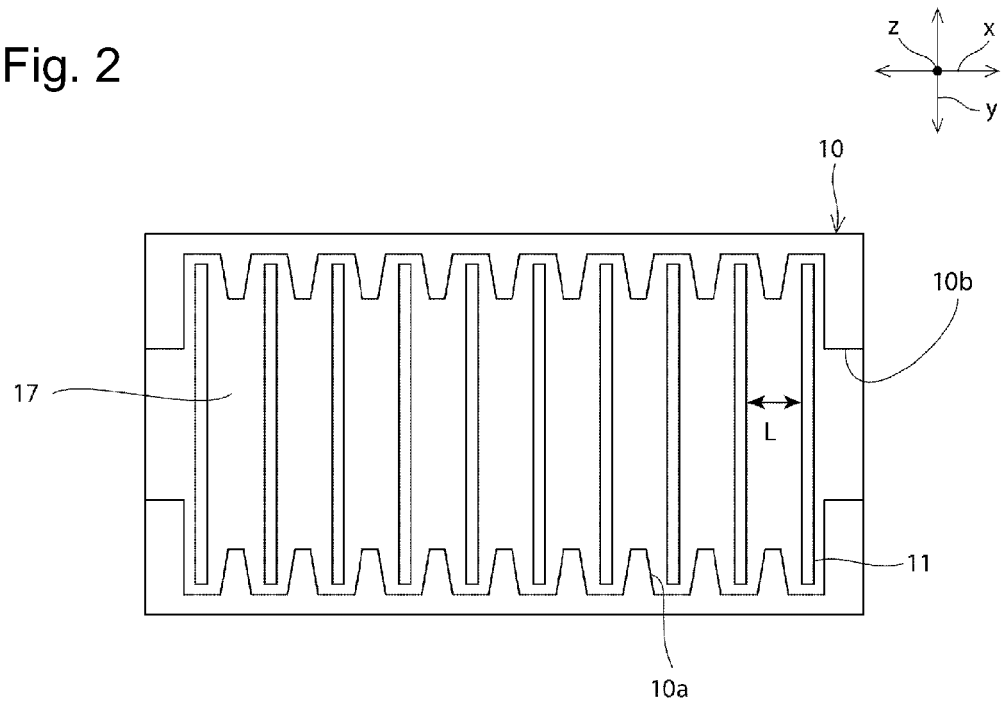
FIG. 2 is a schematic plan view of the cassette in the first embodiment.

First, substrates 11 are set in cassette 10 illustrated in FIG. 1 and FIG. 2, for example. Here, substrates 11 may be each the substrate made of a semiconductor material, or the substrate made of a semiconductor material and provided with a semiconductor layer or the like on its surface.

The shape of cassette 10 is not particularly limited as long as cassette 10 has a shape that can hold substrates 11 at intervals in one direction. In the embodiment, recesses 10a are provided on two side faces of cassette 10. Recesses 10a provided on the side face on one side of cassette 10 and recesses 10a provided on the side face on the other side thereof are opposed to one another in a y-axis direction. Each substrate 11 is inserted to a pair of recesses 10a opposed to each other in the y-axis direction. Thus, substrates 11 are held at intervals in an x-axis direction.

Recesses 10a extend in a z-axis direction, which is a vertical direction. A space between two side wall portions defining each recess 10a spreads toward substrate 11. In other words, the space between the two side wall portions defining each recess 10a spreads toward the center in the y-axis direction. In this way, substrates 11 are kept from coming into contact with cassette 10 in a large contact area.

Cutouts 10b or openings are provided on side wall portions located on two sides in the x direction of cassette 10. Meanwhile, a wall surface is not provided at the bottom of cassette 10. Accordingly, the chemical solution, bubbles, and the like can enter cassette 10 from below cassette 10.

The shape of substrates 11 is not particularly limited. For example, substrates 11 may have a rectangular shape, a square shape, a polygonal shape, a circular shape, or the like. Meanwhile, substrates 11 may have such a shape as a substantially rectangular shape or a substantially square shape obtained by cutting its corner or corners off by straight lines or curved lines, for example. The following description is given of an example in which substrates 11 have a substantially rectangular shape.

A length of one side of substrates 11 can be set in a range from about 100 mm to 200 mm, for example. A thickness of substrates 11 is set preferably equal to or below about 200 µm, or more preferably in a range from about 50 µm to 250 µm. A ratio of the length of one side of substrates 11 to the thickness of substrates 11 ((the length of one side of substrates 11)/(the thickness of substrates 11)) is set preferably in a range from 400 to 40000.

Although the number of substrates 11 to be held in one cassette 10 is not particularly limited, the number may be set in a range from about 25 to 100, for example. From the viewpoint of increasing the number of substrates 11 settable in one cassette 10, a length L between substrates 11 adjacent in the x-axis direction is preferably equal to or below 6 mm, or more preferably equal to or below 5 mm. The distance L between substrates 11 adjacent in the x-axis direction is preferably equal to or below 1/20 of the length of one side of substrates 11 or more preferably equal to or below 1/30 thereof. However, if the distance L between substrates 11 adjacent in the x-axis direction is too small, it may be difficult to set substrates 11, or a problem such as adjacent substrates 11 sticking to each other at the time of wet etching may occur. Accordingly, the distance L between substrates 11 adjacent in the x-axis direction is preferably equal to or above 3 mm or more preferably equal to or above 4 mm. The distance L between substrates 11 adjacent in the x-axis direction is preferably equal to or above 1/42 of the length of one side of substrates 11 or more preferably equal to or above 1/32 of the length of one side of substrates 11.

(Processing Step of Substrates 11)

Figure 3:
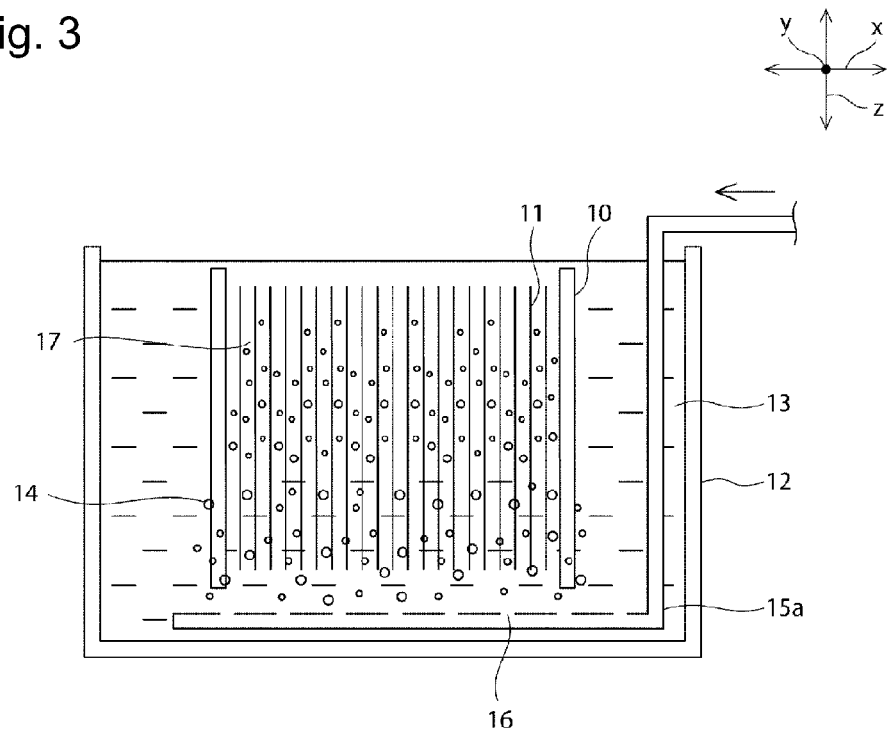
FIG. 3 is a schematic front view for explaining a processing step in the first embodiment.

Next, as illustrated in FIG. 3, the processing step of processing substrates 11 is performed by immersing substrates 11, which are set in cassette 10 and arranged at intervals in the x-axis direction, in chemical solution 13 stored in chemical solution tank 12 together with cassette 10. The processing step is equivalent to the etching step, the cleaning step, and the like performed on substrates 11. When the etching step is performed, for example, the etching solution can be used as chemical solution 13. When the cleaning step is performed, for example, the cleaning solution can be used as chemical solution 13.

In the processing step, substrates 11 are processed by: immersing substrates 11 in chemical solution 13; and agitating chemical solution 13 by supplying gas bubbles 14 (typically, gas bubbles of air, an inert gas such as nitrogen gas, and the like) or a liquid into chemical solution 13. Specifically, the embodiment describes an example of supplying gas bubbles 14 to chemical solution 13. However, it is not always necessary to supply gas bubbles 14 to chemical solution 13. A material to be supplied to chemical solution 13 is not particularly limited as long as such a material can agitate chemical solution 13. For instance, a liquid having the same composition as chemical solution 13 may be supplied to chemical solution 13. Naturally, it is also possible to additionally supply the liquid to chemical solution 13 while supplying gas bubbles 14 thereto.

To be more precise, in the embodiment, gas bubbles 14 are supplied to chemical solution 13 in the processing step so as to bring about alternate occurrence of a first state and a second state. Here, the first state is a state in which an amount of gas bubbles 14 supplied to one side in the x-axis direction of certain substrate 11 is greater than an amount of gas bubbles 14 supplied to the second side in the x-axis direction of substrate 11. The second state is a state in which the amount of gas bubbles 14 supplied to the one side in the x-axis direction of substrate 11 is smaller than the amount of gas bubbles 14 supplied to the other side in the x-axis direction of substrate 11.

Figure 4:
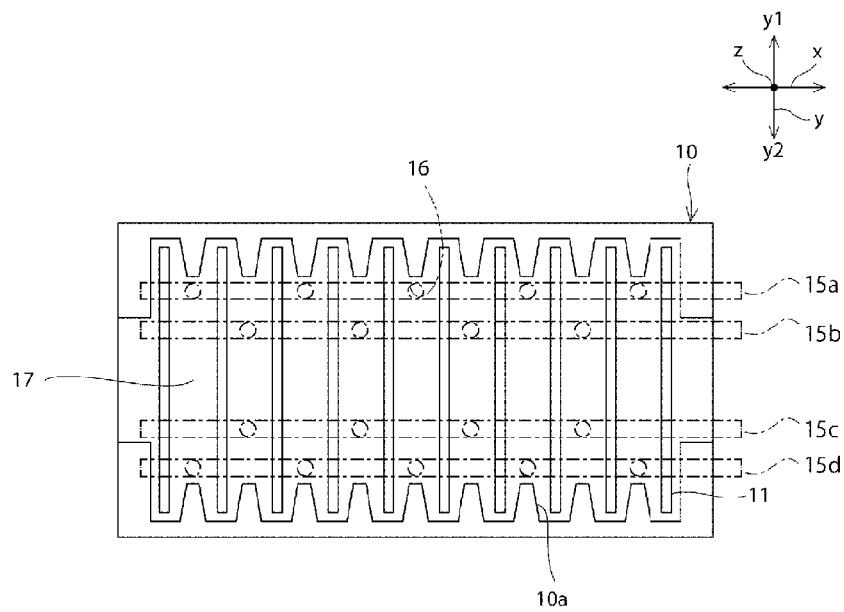
FIG. 4 is a schematic plan view representing relations between gas bubble supply holes and substrates in the first embodiment.

Specifically, as illustrated in FIG. 4, pipes 15a to 15d are arranged below substrates 11. Each of pipes 15a to 15d includes openings 16 and ejects gas bubbles 14 from openings 16 toward substrates 11.

Each of pipes 15a to 15d extends in the x-axis direction which is the direction of arrangement of substrates 11. Pipes 15a to 15d are arranged at intervals in the y-axis direction which is parallel to the extending direction of substrates 11. Pipe 15a and pipe 15b are located on y1 side from the center in the y-axis direction of substrates 11. Pipe 15a is provided on the outside of pipe 15b. Pipe 15c and pipe 15d are located on y2 side from the center in the y-axis direction of substrates 11. Pipe 15d is provided on the outside of pipe 15c.

Each of pipes 15a to 15d is provided with openings 16 in such a way as to be located at gaps 17 between substrates 11. In each of pipes 15a to 15d, each of openings 16 is provided at every other gap 17. In other words, openings 16 are provided in such a way that gaps 17 where openings 16 are located and gaps 17 where openings 16 are not located alternate in the x-axis direction.

Openings 16 of pipes 15a, 15d provided on the outside are located at different gaps 17 from gaps 17 where openings 16 of pipes 15b, 15c provided on the inside are located. As a consequence, gaps 17 where openings 16 of pipes 15a, 15d provided on the outside are located and gaps 17 where openings 16 of pipes 15b, 15c provided on the inside are located are alternately provided in the x-axis direction.

Figure 5:
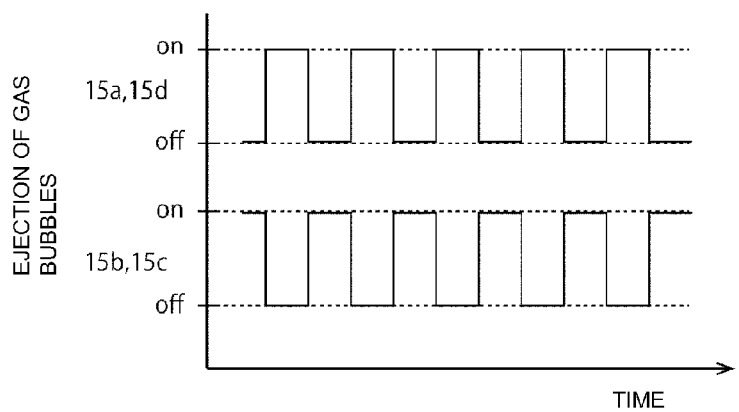
FIG. 5 is a timing chart for explaining timing to eject gas bubbles from pipes 15a to 15d in the first embodiment.

As illustrated in FIG. 5, gas bubbles 14 are controlled in the first state in such a way that the amount of gas bubbles 14 ejected from openings 16 of pipes 15a, 15d is greater than the amount of gas bubbles 14 ejected from openings 16 of pipes 15b, 15c. On the other hand, gas bubbles 14 are controlled in the second state in such a way that the amount of gas bubbles 14 ejected from openings 16 of pipes 15a, 15d is smaller than the amount of gas bubbles 14 ejected from openings 16 of pipes 15b, 15c. By conducting the above-described control, the first state in which the amount of gas bubbles 14 supplied to the one side in the x-axis direction of substrate 11 is greater than the amount of gas bubbles 14 supplied to the other side in the x-axis direction of substrate 11, and the second state in which the amount of gas bubbles 14 supplied to the one side in the x-axis direction of substrate 11 is smaller than the amount of gas bubbles 14 supplied to the other side in the x-axis direction of substrate 11, occur alternately. For this reason, gas bubbles 14 supplied in the first state and gas bubbles supplied in the second state cause substrates 11 to oscillate or swing in the x-axis direction. Accordingly, a state where a portion of certain substrate 11 is in contact with different substrate 11 or cassette 10 is less likely to continue. Thus, the entirety of such substrate 11 is more likely to come into contact with chemical solution 13 uniformly. As a consequence, it is possible to process substrates 11 favorably. Hence, it is less likely to cause insufficiently cleaned portions or insufficiently etched portions on the surfaces of substrates 11. Meanwhile, when the processing step is the etching step of forming the relief structure so called the texture structure by performing anisotropic etching, the relief structure thus formed is unlikely to involve unevenness in shape or dimension. It is therefore possible to form a solar cell with an improved production yield.

From the perspective of further facilitating the oscillation or the swing of substrates 11, it is preferable to supply gas bubbles 14 to the one side in the x-axis direction of substrate 11 while not supplying gas bubbles 14 to the other side in the x-axis direction of substrate 11 in the first state, and meanwhile, not to supply gas bubbles 14 to the one side in the x-axis direction of substrate 11 while supplying gas bubbles 14 to the other side in the x-axis direction of substrate 11 in the second state. Moreover, it is preferable that a position of supply of gas bubbles 14 on the one side in the x-axis direction of substrate 11 be different from a position of supply of gas bubbles 14 on the other side in the x-axis direction of substrate 11 in terms of the y-axis direction which is the extending direction of substrate 11. Meanwhile, since each recess 10a is provided such that its space spreads inward, the oscillation or the swing of substrate 11 is further facilitated.

Substrates 11 are more flexible when each substrate 11 has a small thickness of equal to or below 200 µm, for example. Accordingly, there may be a case in which adjacent substrates 11 come into contact with each other whereby the chemical solution is less likely to be supplied properly to contact portions of substrates 11. Likewise, if an interval between adjacent substrates 11 is equal to or below 1/20, or even equal to or below 1/30 of the length of one side of substrates 11 when the planar shape of substrates 11 is approximated to a rectangle, there may be a case in which adjacent substrates 11 come into contact with each other whereby the chemical solution is less likely to be supplied properly to contact portions of substrates 11. The technique of the embodiment is especially useful in this case.

Figure 6:
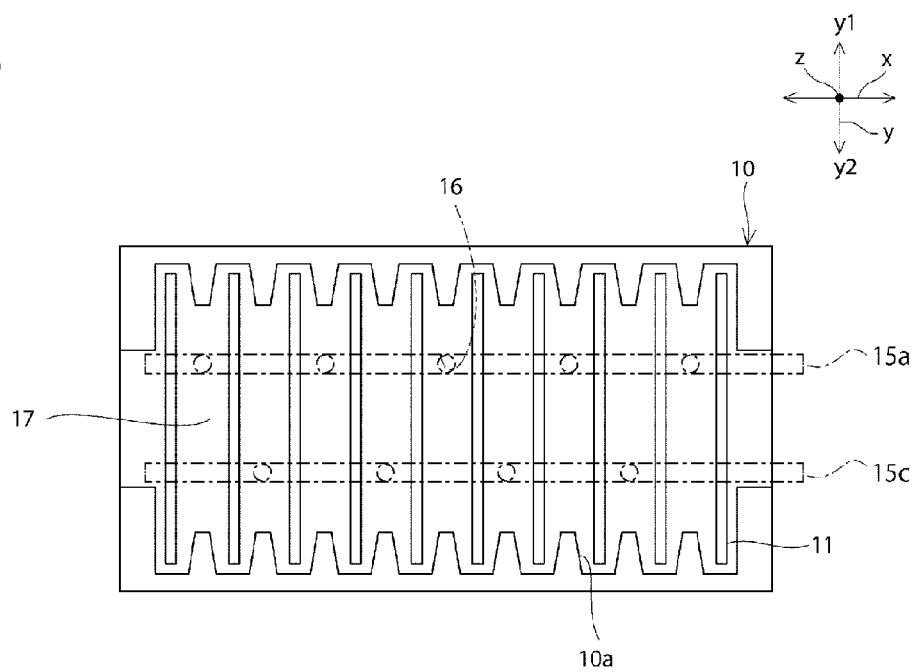
FIG. 6 is a schematic plan view representing relations between gas bubble supply holes and substrates in a second embodiment.

Note that the first embodiment describes the example of providing two pipes 15a, 15b that supply gas bubbles 14 to the one side of substrate 11 and two pipes 15b, 15c that supply gas bubbles 14 to the other side of substrate 11, respectively. The invention, however, is not limited only to this configuration. For example, as illustrated in FIG. 6, it is also possible to provide one pipe 15a that supplies gas bubbles 14 to the one side of substrate 11 and one pipe 15c that supplies gas bubbles 14 to the other side of substrate 11, respectively.

Moreover, the first embodiment describes the example in which gas bubbles 14 are supplied simultaneously from openings 16 of pipes 15a, 15d to substrate 11 while gas bubbles 14 are supplied simultaneously from openings 16 of pipes 15b, 15c to substrate 11. The invention, however, is not limited only to this configuration. For example, gas bubbles 14 may be supplied simultaneously from openings 16 of pipes 15a, 15c to substrate 11 while gas bubbles 14 may be supplied simultaneously from openings 16 of pipes 15b, 15d to substrate 11. When gas bubbles 14 are supplied simultaneously from openings 16 of pipes 15a, 15c, substrate 11 is caused to oscillate or swing in a clockwise direction in FIG. 4. When gas bubbles 14 are supplied simultaneously from openings 16 of pipes 15b, 15d, substrate is caused to oscillate or swing in a counterclockwise direction in FIG. 4.

In the above-described example, openings 16 provided to pipes 15a to 15d are located at gaps 17 between adjacent substrates 11. The invention, however, is not limited only to this configuration. For example, openings 16 may be respectively provided on the one side and the other side of certain substrate 11 regardless of the position of gap 17 or the position of substrate 11.

Meanwhile, it is also possible to bring about the first state in which the openings provided to the pipes are located on the one side of the substrate and the second state in which the openings are located on the other side thereof by swinging the pipes in the x-axis direction.

In this way, the embodiments described above provide methods capable of manufacturing a solar cell with an improved production yield.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

The invention claimed is:

1. A method of manufacturing a solar cell including a substrate made of a semiconductor material, comprising:
processing substrates arranged in one direction by immersing the substrates in a chemical solution, and by agitating the chemical solution by simultaneously supplying gas bubbles to the substrates into the chemical solution, wherein
in the processing, the gas bubbles are supplied from supplying portions positioned at respective positions between respective adjacent substrates of the substrates,
in the processing, the gas bubbles are supplied so as to bring about a first state and a second state for each substrate of the substrates, the first state and the second state occurring in alternate ones of the respective positions between the respective adjacent substrates, where the first state is a state in which a first non-zero amount of the gas bubbles supplied to a first side in the one direction of a substrate is greater than a second non-zero amount of the gas bubbles supplied to a second side in the one direction of the substrate, and the second state is a state in which the first amount of the gas bubbles supplied to the first side in the one direction of the substrate is smaller than the second amount of the gas bubbles supplied to the second side in the one direction of the substrate, and the first amount and the second amount of the gas bubbles are supplied simultaneously to the substrates such that the first state and the second state in the substrates occur simultaneously in sides of the respective adjacent substrates exposed to alternating ones of the respective positions; and
the first amount of the gas bubbles and the second amount of gas bubbles are simultaneously supplied so as to cause each of the substrates to swing so as to agitate the chemical solution.

2. The method of manufacturing a solar cell according to claim 1, wherein
in the first state, the gas bubbles are supplied to the first side in the one direction of the substrate while the gas bubbles are not supplied to the second side in the one direction of the substrate, and
in the second state, the gas bubbles are not supplied to the first side in the one direction of the substrate while the gas bubbles are supplied to the second side in the one direction of the substrate.

3. The method of manufacturing a solar cell according to claim 1, wherein a position of supply of the gas bubbles on the first side in the one direction of the substrate and a position of supply of the gas bubbles on the second side in the one direction of the substrate are different from each other in an extending direction of the substrate, the extending direction of the substrate perpendicular to the one direction.

4. The method of manufacturing a solar cell according to claim 1, wherein the processing is performed in a state where the substrates are set in a cassette comprising recesses, each recess extending in a vertical direction, allowing insertion of an end portion in a width direction of the substrate, and containing a space which widens toward the substrate.

5. The method of manufacturing a solar cell according to claim 1, wherein the substrates are arranged in such a way that an interval between the substrates adjacent to each other is set equal to or below 1/20 of a length of one side of the substrates when a planar shape of the substrates is approximated to a rectangle.

6. The method of manufacturing a solar cell according to claim 1, wherein a thickness of each substrate is equal to or below 200 μm.

7. The method of manufacturing a solar cell according to claim 1, wherein the processing includes at least one of cleaning the substrates by immersing the substrates in a cleaning solution, and etching the substrates by immersing substrates in an etching solution.

8. The method of manufacturing a solar cell according to claim 1, wherein
in the processing, the gas babbles are supplied from holes of pipes, the holes being positioned at the respective positions between the respective adjacent substrates of the substrates and
each pipe extends along the one direction from the first side of a group of the substrates to the second side of the group of the substrates.

9. The method of manufacturing a solar cell according to claim 1, wherein
the substrates include a first substrate, a second substrate, a third substrate, and a fourth substrate arranged in this order along the one direction,
in the processing,
at a first timing, the first state in the first substrate and the third substrate and the second state in the second substrate and the fourth substrate occur simultaneously, and
at a second timing after the first timing, the second state in the first substrate and the third substrate and the first state in the second substrate and the fourth substrate occur simultaneously,
at a third timing after the second timing, the first state in the first substrate and the third substrate and the second state in the second substrate and the fourth substrate occur simultaneously, and
at a fourth timing after the third timing, the second state in the first substrate and the third substrate and the first state in the second substrate and the fourth substrate occur simultaneously.

10. The method of manufacturing a solar cell according to claim 1, wherein
the substrates include a first substrate, a second substrate, and a third substrate arranged in this order along the one direction,
in the processing, at any timing,
the state in the first substrate is same as the state in the third substrate,
the state in the second substrate between the first substrate and the second substrate along the one direction is different from the state in the first substrate and the third substrate.

* * * * *